United States Patent [19]

Matsuda et al.

[11] Patent Number: 4,661,426
[45] Date of Patent: Apr. 28, 1987

[54] PROCESS FOR MANUFACTURING METAL SILICIDE PHOTOMASK

[75] Inventors: Shuichi Matsuda; Akira Shigetomi, both of Itami, Japan

[73] Assignee: Mitsubishi Denki Kabushiki Kaisha, Tokyo, Japan

[21] Appl. No.: 846,518

[22] Filed: Mar. 31, 1986

[30] Foreign Application Priority Data

May 29, 1985 [JP] Japan .................. 60-115864

[51] Int. Cl.$^4$ .............................................. G03F 9/00
[52] U.S. Cl. ....................................... 430/5; 430/296; 430/323; 430/324; 430/942; 428/428
[58] Field of Search ............... 430/5, 323, 321, 324, 430/296, 942; 428/428; 378/35

[56] References Cited

U.S. PATENT DOCUMENTS 4,393,127  7/1983  Greschner et al. .............. 430/5

Primary Examiner—John E. Kittle
Assistant Examiner—José G. Dees
Attorney, Agent, or Firm—Lowe Price LeBlanc Becker & Shur

[57] ABSTRACT

A metal silicide photomask manufacturing process including a step of forming metal silicide film on a transparent silica glass substrate. A resist is applied onto the metal silicide film and then a patterning mask is drawn by using light or electron beam, followed by developing step, so that some portion of the applied resist can be removed wherein the metal silicide is exposed. Scum is removed by oxygen plasma etching process, thereby to form an oxide film on an exposed portion of the metal silicide. The left resist portion and the portion of the metal silicide film laying under the resist portion is etched away using a dry etching process in which the oxide film serves as a mask.

3 Claims, 8 Drawing Figures

RRIOR ART

PROCESS FOR MANUFACTURING METAL SILICIDE PHOTOMASK

BACKGROUND OF THE INVENTION

1. Field of the Invention

The present invention relates to a process for manufacturing metal silicide photomask and, more particularly, to a process for manufacturing a metal silicide photomask for use with manufacture of a semiconductor device.

2. Description of the Prior Art

FIGS. 1A to 1D show sequential steps of a metal silicide photomask manufacturing process which is disclosed in co-pending U.S. Application Ser. No. 819,102, filed Jan. 15, 1986, by Watakabe et al., assigned to the same assignee of the present application. First of all, the process of manufacturing a metal silicide photomask will be described with reference to FIGS. 1A to 1D. First, as shown in FIG. 1A, a transparent glass substrate 1, such as silica glass, is prepared and then a metal silicide film 2, such as a titanium silicide, a molybdenum silicide and a tungsten silicide is formed on the transparent glass substrate 1 by means of sputtering process or the like, with a thickness of about 1000 Å. Then, as shown in FIG. 1B, a resist 3 is applied onto the metal silicide film 2, a desired pattern is drawn by light or electron beam and then developing process is achieved, so that a resist pattern can be formed. Thereafter, as shown in FIG. 1C, exposed portion of the metal silicide film 2 is etched away by gas plasma process. For example, if and when molybdenum silicide (MoSi$_2$) is used as a metal silicide film 2, an etching rate of about 500–1000 Å/min is obtained, with a mixed gas of CF$_4$+O$_2$ (2%–20%), vacuum of 0.2 Torr and 300 W. Then, the exposed portion of metal silicide film 2 is etched away, and the resist pattern is removed by means of an oxygen plasma 4, so that a mask pattern of metal silicide is formed, completing the formation of a photomask for use in a process of a semiconductor device.

However, in accordance with the proposed process as described in the foregoing, only a high dry etching-resistant resist can be used and a resist film should be sufficiently thick. Therefore, there is a limitation for very fine patterning, and, if a surface of a metal silicide film is once oxidized, the etching speed becomes slower and hence complete etching may not be achieved.

Incidentally, Japanese Patent Application No. 42176/1981, filed Mar. 23, 1981 and laid open for public inspection Sept. 28, 1982 and Japanese Patent Application No. 42183/1981, filed Mar. 23, 1981 and laid open for public inspection Sept. 28, 1982 disclose that a silicon layer and a metal layer are deposited on a glass substrate so that a pattern of silicide is formed by an electron beam.

SUMMARY OF THE INVENTION

Accordingly, a principal object of the present invention is to eliminate the above described defects and to provide a process of manufacturing a metal silicide photomask which can provide a very fine patterning and can simplify the process.

Briefly stated, the present invention is directed to a process for manufacturing a metal silicide photomask comprising the steps of preparing a transparent substrate, forming a metal silicide film on the transparent substrate, applying a resist on the metal silicide film, drawing a desired mask pattern on the resist by using light or electron beam and developing the pattern so that some portion of the applied resist can be removed and the corresponding portion of the metal silicide can be exposed, removing scum by using oxygen containing plasma process, thereby to form an oxide film on the exposed portion of the metal silicide film, and etching away the left resist portion and the portion of the metal silicide film laying under the resist portion, using a dry etching process in which the oxide film serves as a mask.

According to the present invention, in removing scum, an oxide film can be formed on the exposed portion of the metal silicide film by an oxygen containing plasma process, and thus, in etching of the metal silicide film, the resist and the metal silicide film can be simultaneously etched away while the oxide film serves as a mask, whereby the process can be simplified and thin resist film can be used, so that good fine patterning with good precision can be obtained.

According to a preferred embodiment of the present invention, the scum removing process includes a plasma etching process of oxygen or wet air for 5 through 7 minutes by means of a barrel type of a plasma apparatus or includes an oxygen plasma etching process for 1 to 2 minutes by means of a parallel flat plate type plasma apparatus.

These object and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
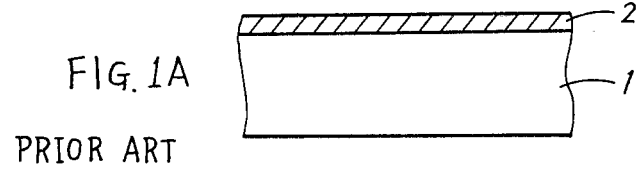
FIGS. 1A through 1D are drawings for explaining the process of manufacturing a metal silicide photomask which is disclosed in the related co-pending U.S. application Ser. No. 819,102, filed Jan. 15, 1986.
Figure 1B:
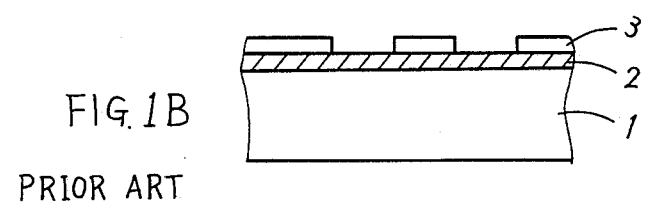
Figure 1C:
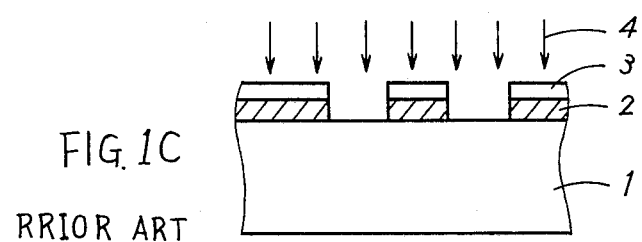
Figure 1D:
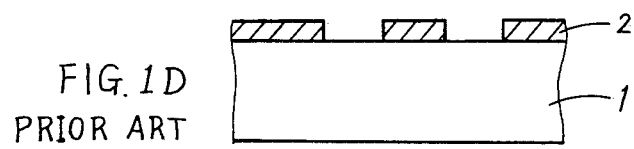
Figure 2A:
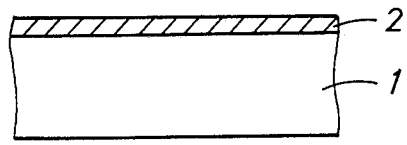
FIGS. 2A to 2D are drawings for explaining a process of manufacturing a metal silicide photomask of the present invention.
Figure 2B:
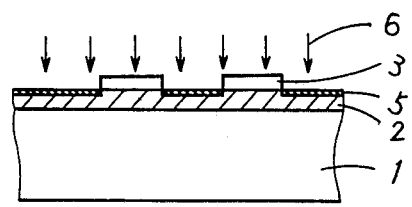
Figure 2C:
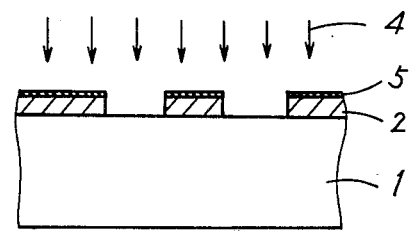
Figure 2D:
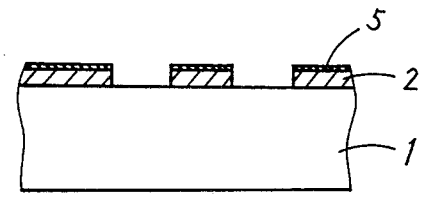

FIGS. 2A to 2D are cross sectional views showing a process of manufacturing a metal silicide photomask of one embodiment of the present invention. First of all, referring to FIG. 2A, a transparent glass substrate 1, such as a silica glass, is prepared and then a metal silicide film 2, such as titanium silicide, molybdenum silicide and tungsten silicide, is formed on the transparent glass substrate 1, with about 1000Å in thickness, using a sputtering process or electron beam and the like in which metal, such as titanium (Ti), molybedenum (Mo) and tungsten (W) is used as a target. Then, referring to FIG. 2B, an electron beam (EB) resist or photoresist 3 is first applied onto the whole surface of the metal silicide film 2 and thereafter, a desired pattern is drawn by light or electron beam so that a resist pattern is formed as shown in FIG. 2B. At this stage, scum is formed over the whole surface of the device. Therefore, the scum should be removed. In accordance with the present invention, the scum is removed by an oxygen-containing plasma etching process so that the exposed surface of the metal silicide film 2 is oxidized and hence an oxide film 5 having a good etching-resistant characteristic is formed thereon. In removing the scum, a plasma apparatus of barrel type can be used in which case an oxygen or wet air plasma etching process is achieved for 5 through 7 minutes. Alternatively, a plasma apparatus of parallel flat plate type can be also used in which case an oxygen plasma etching process is achieved for 1 to 2 minutes for removing the scum. Then, as shown in FIG. 2C, the resist 3 and the metal silicide film 2 laying under the resist 3 are etched away by dry etching process, in which case the oxide film 5 serves as a mask. For example, if and when the metal silicide film 2 is a molybdenum silicide, an etching rate of about 500–1000 Å/min n is obtained, with a mixed gas of $CF_4+O_2$ (2–20%), vacuum of 0.2 Torr and 300 W. Finally, as shown in FIG. 2D, a mask pattern of a metal silicide film 2 with an oxide film 5 is formed, completing the formation of a photomask for use in a process of a semiconductor device.

In accordance with the embodiment of the present invention, an additional time is required for etching a resist in etching the molybdenum silicide. However, since the step of removing the resist can be eliminated, throughput time can be largely improved as a whole. In addition, according to the embodiment of the present invention, the resist does not necessarily have a dry etching-resistant characteristic and the thickness of the resist film can be reduced. Therefore, fine patterning with good precision and high resolution can be obtained.

As described in the foregoing, according to a process of manufacturing a metal silicide photomask of the present invention, the step of removing a resist can be eliminated since an oxide film is formed on the exposed surface of the metal silicide when the scum is removed and the resist and the metal silicide film laying under the resist are etched away in etching process. In addition, a photomask having a fine patterning with good precision and high resolution can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for manufacturing a metal silicide photomask comprising the steps of:
   preparing a transparent substrate;
   forming a metal silicide film on said transparent substrate;
   applying a resist on said metal silicide film;
   drawing a desired mask pattern on the resist by using light or electron beam and developing the pattern so that some portion of the applied resist can be removed and the corresponding portion of the metal silicide can be exposed;
   removing a scum by using an oxygen-containing plasma etching process, thereby to form an oxide film on the exposed portion of the metal silicide film; and
   etching away the left resist portion and the portion of the metal silicide film laying under the resist portion using a dry etching process in which said oxide film serves as a mask.

2. A process for manufacturing a metal silicide photomask in accordance with claim 1, wherein
   said scum removing step comprises plasma etching process of oxygen or wet air for 5 through 7 minutes by means of a plasma apparatus of barrel type.

3. A process for manufacturing a metal silicide photomask in accordance with claim 1, wherein
   said scum removing step comprises an oxygen plasma etching process for 1 to 2 minutes by means of a plasma apparatus parallel of plate type.

* * * * *